(12) United States Patent
Suzuka et al.

(10) Patent No.: US 9,013,023 B2
(45) Date of Patent: Apr. 21, 2015

(54) PHOTOELECTRIC ELEMENT HAVING STACKED CHARGE-TRANSPORT LAYERS

(71) Applicants: Panasonic Corporation, Osaka (JP); Waseda University, Tokyo (JP)

(72) Inventors: Michio Suzuka, Osaka (JP); Takashi Sekiguchi, Osaka (JP); Naoki Hayashi, Kyoto (JP); Hiroyuki Nishide, Tokyo (JP); Kenichi Oyaizu, Tokyo (JP); Fumiaki Kato, Tokyo (JP)

(73) Assignees: Panasonic Corporation, Osaka (JP); Waseda University, Tokyo (JP)

( * ) Notice: Subject to any disclaimer, the term of this patent is extended or adjusted under 35 U.S.C. 154(b) by 0 days.

(21) Appl. No.: 14/114,490

(22) PCT Filed: Dec. 18, 2012

(86) PCT No.: PCT/JP2012/082728
§ 371 (c)(1),
(2) Date: Oct. 28, 2013

(87) PCT Pub. No.: WO2013/099689
PCT Pub. Date: Jul. 4, 2013

(65) Prior Publication Data
US 2014/0070202 A1 Mar. 13, 2014

(30) Foreign Application Priority Data
Dec. 28, 2011 (JP) ................. 2011-287223

(51) Int. Cl.
*H01L 31/06* (2012.01)
*H01G 9/20* (2006.01)
*H01L 51/50* (2006.01)

(52) U.S. Cl.
CPC .......... *H01G 9/2018* (2013.01); *H01G 9/2031* (2013.01); *H01G 9/2059* (2013.01); *Y02E 10/542* (2013.01); *H01L 51/5064* (2013.01); *H01L 51/508* (2013.01)

(58) Field of Classification Search
CPC .................. H01L 51/5064; H01L 51/508
USPC .......... 257/461, E31.052, E31.058, E31.063, 257/E31.096, E31.115
See application file for complete search history.

(56) References Cited

U.S. PATENT DOCUMENTS 4,914,489 A * 4/1990 Awano .............................. 257/6
4,927,721 A 5/1990 Gratzel et al.
(Continued)

FOREIGN PATENT DOCUMENTS

EP 0 718 288 A1 6/1996
JP 2664194 B 6/1997
(Continued)

OTHER PUBLICATIONS

International Search Report for corresponding International Application No. PCT/JP2012/082728 mailed Mar. 5, 2013.
(Continued)

*Primary Examiner* — Ida M Soward
(74) *Attorney, Agent, or Firm* — Renner, Otto, Boisselle & Sklar, LLP

(57) ABSTRACT

A photoelectric element includes a first electrode; and a second electrode positioned so as to face the first electrode; and a semiconductor disposed on a face of the first electrode, the face being positioned so as to face the second electrode; and a photosensitizer carried on the semiconductor; and a first charge-transport layer interposed between the first electrode and the second electrode; and a second charge-transport layer interposed between the first charge-transport layer and the second electrode. The first charge-transport layer and the second charge-transport layer contain different oxidation-reduction materials. The oxidation-reduction material in the first charge-transport layer has an oxidation-reduction potential higher than an oxidation-reduction potential of the oxidation-reduction material in the second charge-transport layer.

11 Claims, 3 Drawing Sheets

(56) References Cited

U.S. PATENT DOCUMENTS

| | | | |
|---|---|---|---|
| 5,084,365 A * | 1/1992 | Gratzel et al. | 429/111 |
| 5,350,459 A * | 9/1994 | Suzuki et al. | 136/263 |
| 5,488,601 A * | 1/1996 | Sakano et al. | 369/120 |
| 5,629,920 A * | 5/1997 | Sakano et al. | 369/120 |
| 5,717,626 A * | 2/1998 | Aoki et al. | 365/112 |
| 6,352,777 B1 * | 3/2002 | Bulovic et al. | 428/411.1 |
| 6,835,512 B2 * | 12/2004 | Morikawa et al. | 430/58.05 |
| 8,158,881 B2 * | 4/2012 | Brabec et al. | 136/263 |
| 2008/0180583 A1 * | 7/2008 | Harada et al. | 349/12 |
| 2009/0262773 A1 * | 10/2009 | Ahlstedt et al. | 372/46.013 |
| 2012/0199935 A1 * | 8/2012 | Chen et al. | 257/461 |
| 2013/0025683 A1 * | 1/2013 | Sekiguchi et al. | 136/263 |

FOREIGN PATENT DOCUMENTS

| | | |
|---|---|---|
| JP | 11-260428 A | 9/1999 |
| JP | 2001-085077 A | 3/2001 |
| JP | 2003-100360 A | 4/2003 |
| JP | 2004-119279 A | 4/2004 |
| JP | 2009-021212 A | 1/2009 |
| JP | 2010-067959 A | 3/2010 |
| JP | 2011-006665 A | 2/2011 |
| JP | 2011-034813 A | 2/2011 |
| JP | 2011-096399 A | 5/2011 |
| WO | WO 95/18456 A1 | 7/1995 |
| WO | WO 2010/147162 A1 | 12/2010 |

OTHER PUBLICATIONS

Form PCT/ISA/237 for corresponding International Application No. PCT/JP2012/082728 dated Mar. 5, 2013.

Papageorgiou et al., "The Performance and Stability of Ambient Temperature Molten Salts for Solar Cell Applications", J. Electrochem. Soc., vol. 143, No. 10, Oct. 1996, p. 3099-3108 (1996).

"The recent development of the polymer solid electrolyte", *Denki Kagaku* (*Electrochemistry*), vol. 65, No. 11, p. 923 (1997) and English Abstract.

Bonhôte et al., "Hydrophobic, Highly Conductive Ambient-Temperature Molten Salts", Inorg. Chem., vol. 35, p. 1168-1178 (1996).

* cited by examiner

PHOTOELECTRIC ELEMENT HAVING STACKED CHARGE-TRANSPORT LAYERS

TECHNICAL FIELD

The present invention relates to a photoelectric element converting light into electricity or electricity into light.

BACKGROUND ART

In recent years, photoelectric elements have been used as, for example, electricity generation elements (e.g., a photovoltaic cell and a solar cell), which generate electricity by means of photoelectric conversion, light-emitting elements (e.g., an organic EL element), optical display elements (e.g., an electrochromic display element and an electronic paper), and sensor elements sensing temperature, light, or the like. Among them, a p-n junction element has been put into practice as a photoelectric element for a solar cell or the like. In addition, various photoelectric elements using techniques with regard to photoelectrochemistry have been developed as disclosed in Patent Literature 1. This photoelectric element is prepared by interposing a charge-transport layer containing an electrolyte or the like between a first electrode with a semiconductor attached and a second electrode. The semiconductor typically supports a dye, which is a photosensitizer, and therefore the photoelectric element is used as a dye-sensitized solar cell. Accordingly, applying light to the semiconductor makes the semiconductor to generate charges; the charges transfer through the charge-transport layer; and electricity can be extracted to the outside through the first electrode with the semiconductor as the negative electrode (anode) and through the second electrode as the positive electrode (cathode).

With regard to a photoelectrochemical device including such a photoelectric element, Patent Literature 2 discloses that a radical compound is provided so as to be in contact with a semiconductor. In this device, careers (holes or electrons) generated through irradiation of the semiconductor are involved in a redox reaction (oxidation-reduction reaction) of the radical compound, and the radical compounds serve as a redox pair, which causes an electrochemical oxidation or reduction. Therefore, speed of a response to irradiation of the semiconductor is increased, and stability and reproducibility are improved.

However, in the device as shown in Patent Literature 2, with regard to electrons and holes which are separated by photosensitizer, a transfer of charges is not performed efficiently in a process that holes transfer to an electrode, and therefore photoelectric conversion efficiency is insufficient.

CITATION LIST

Patent Literature

Patent Literature 1: JP2664194 B
Patent Literature 2: JP2003-100360 A

SUMMARY OF INVENTION

Technical Problem

In view of the above circumstances, the present invention has aimed to provide a photoelectric element having excellent photoelectric conversion efficiency.

Solution to Problem

A photoelectric element in accordance with the present invention includes: a first electrode; and a second electrode positioned so as to face the first electrode; and a semiconductor disposed on a face of the first electrode, the face being positioned so as to face the second electrode; and a photosensitizer carried on the semiconductor; and a first charge-transport layer interposed between the first electrode and the second electrode; and a second charge-transport layer interposed between the first charge-transport layer and the second electrode, wherein: the first charge-transport layer and the second charge-transport layer contain different oxidation-reduction materials; and the oxidation-reduction material in the first charge-transport layer has an oxidation-reduction potential higher than an oxidation-reduction potential of the oxidation-reduction material in the second charge-transport layer.

In the present invention, it is preferable that the second charge-transport layer and the second electrode are chemically bonded with each other.

In the present invention, it is preferable that the second charge-transport layer is formed of polymer gel.

In the present invention, it is preferable that the photoelectric element further includes a diaphragm, and that the diaphragm is provided on a side of the second charge-transport layer adjacent to the first charge-transport layer and interposed between the first charge-transport layer and the second charge-transport layer.

In the present invention, it is preferable that the diaphragm is selected from a group consisting of porous glass, a cellulose film, a salt bridge, and an ion exchange film.

In the present invention, it is preferable that the oxidation-reduction potential of the oxidation-reduction material in the first charge-transport layer is higher than the oxidation-reduction potential of the oxidation-reduction material in the second charge-transport layer by 60 mV or more.

Advantageous Effects of Invention

The present invention provides a photoelectric element having excellent conversion efficiency.

DESCRIPTION OF EMBODIMENTS

Embodiments for carrying out the present invention will be described hereinafter.

Figure 1:
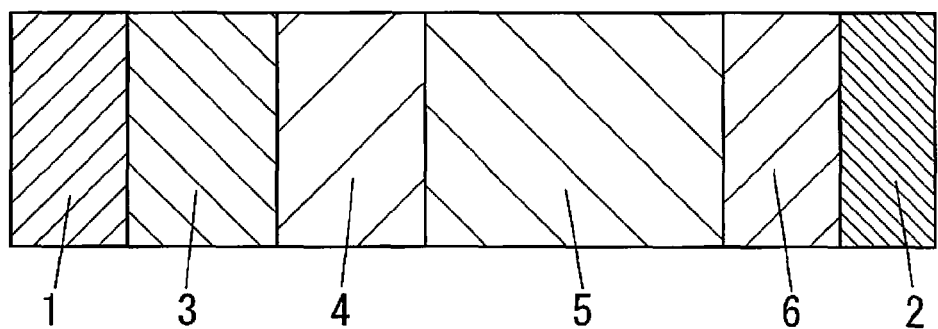
FIG. 1 is a schematic cross-sectional view showing an embodiment in accordance with the present invention.

FIG. 1 shows an example of a photoelectric element in accordance with the present invention. The photoelectric element includes a pair of electrodes, which are a first electrode 1 and a second electrode 2. The first electrode 1 and the second electrode 2 are positioned so as to face each other. A layer of a semiconductor 3 is disposed on an opposite face of the first electrode 1 from the second electrode 2. A photosensitizer 4 is carried on the semiconductor 3. A first charge-transport layer 5 is interposed between the first electrode 1 and the second electrode 2, and a second charge-transport layer 6 is interposed between the first charge-transport layer 5 and the second electrode 2. More specifically, the first charge-transport layer 5 is interposed between the second charge-transport layer 6 and the photosensitizer 4 on the semiconductor 3.

Each of the first electrode 1 and the second electrode 2 may be made of an optically transparent glass or a film, or a metal processed so as to be optically transparent. The metal preferably has a linear (stripe) pattern, a wavy line pattern, a lattice (mesh) pattern, a punching metal form, or a particle aggregate form the viewpoint of economic advantages due to the reduction in material cost because light can pass through their openings and no transparent conductive material is required. A substrate having such a form may be used in combination with a structural member formed of plastic, glass, or the like from the viewpoint of durability of the element.

For an element in which one of the first electrode 1 and the second electrode 2 serves as a light introducing substrate, the other may be made of an optically opaque material. In such a case, the substrate does not always need to be electrical conductive. Preferably, the substrate may be made of an electrically conductive material so as to serve as the first electrode 1 or the second electrode 2. Examples of material of the first electrode 1 and the second electrode 2 include materials such as carbon, aluminum, titanium, iron, nickel, copper, rhodium, indium, tin, zinc, platinum, and gold; and alloys containing at least one material of them. Moreover, as described later, a radical compound is unlikely to corrode metals as compared with halogen ions and other substances, and thus the first electrode 1 and the second electrode 2 may be made of commonly used metals.

The first electrode 1 and the second electrode 2 may be made of the same material. One of the first electrode 1 and the second electrode 2 does not always need to be optically transparent, but both of the first electrode 1 and the second electrode 2 are preferably transparent because such a structure allows light to enter the inside of the structure through the first electrode 1 and to enter the inside of the structure through the second electrode 2. In a case where one of the first electrode 1 and the second electrode 2 is made of a metal foil as described above, the other is preferably made of an optically transparent material.

For example, the first electrode 1 is formed into a film on the substrate and serves as a negative electrode (anode) of the photoelectric element. The first electrode 1 may be formed of a metal alone or may be formed by disposing an electrically conductive material layer on a substrate or a film. Preferred examples of electrically conductive materials include metals such as platinum, gold, silver, copper, aluminum, rhodium, and indium; carbon; electrically conductive metal oxides such as an indium-tin composite oxide, antimony doped tin oxide, and fluorine doped tin oxide; and composite of these materials. In an embodiment of the present invention, a radical compound having high electron transfer rate is used. Thus, in order to suppress a leakage of electrons via a surface of the first electrode 1, that is, in order to secure rectification property, the electrode is preferably made of the aforementioned compound coated with silicon oxide, tin oxide, titanium oxide, zirconium oxide, or aluminum oxide or the like on the aforementioned compound.

This first electrode 1 preferably has a lower surface resistance and the surface resistance is preferably 200 Ω/square or less and more preferably 50 Ω/square or less. The lower limit of the surface resistance is not particularly limited, but is typically 0.1 Ω/square. The first electrode 1 preferably has a higher light transmittance and the light transmittance is preferably 50% or more and more preferably 80% or more. The first electrode 1 preferably has a thickness ranging from 1 to 100 nm. When a thickness is within this range, it is possible to form the electrode film having a uniform thickness, and prevent a decrease in the light transmittance, and allow a sufficient amount of light to enter the semiconductor 3. For an element including the transparent first electrode 1, light is preferably allowed to enter the inside of the element via this first electrode 1 to which the semiconductor 3 is attached.

The second electrode 2 serves as a positive electrode (cathode) of the photoelectric element and can be formed in a similar manner to that for the first electrode 1. The second electrode 2 is preferably made of a material having catalytic action to give electrons to a reduced form of an electrolyte used in the second charge-transport layer 6 described later in order that the second electrode 2 efficiently serves as the positive electrode of the photoelectric element. Examples of such a material include metals such as platinum, gold, silver, copper, aluminum, rhodium, and indium; carbon materials such as graphite, carbon nanotubes, and platinum carried on carbon; electrically conductive metal oxides such as an indium-tin composite oxide, antimony doped tin oxide, and fluorine doped tin oxide; and electrically conductive polymers such as polyethylenedioxythiophene, polypyrrole, and polyaniline. Among them, for example, platinum, graphite, and polyethylenedioxythiophene are particularly preferred.

Examples of materials for the semiconductor 3 include oxides of metallic elements such as Cd, Zn, In, Pb, Mo, W, Sb, Bi, Cu, Hg, Ti, Ag, Mn, Fe, V, Sn, Zr, Sr, Ga, Si, and Cr; perovskites such as $SrTiO_3$ and $CaTiO_3$; sulfides such as CdS, ZnS, $In_2S_3$, PbS, $Mo_2S$, $WS_2$, $Sb_2S_3$, $Bi_2S_3$, $ZnCdS_2$, and $Cu_2S$; metal chalcogenides such as CdSe, $In_2Se_3$, $WSe_2$, HgS, PbSe, and CdTe; and other materials such as GaAs, Si, Se, $Cd_2P_3$, $Zn_2P_3$, InP, AgBr, $PbI_2$, $HgI_2$, and $BiI_3$. Usable examples further include composites containing at least one selected from these semiconductor materials, such as CdS/$TiO_2$, CdS/AgI, $Ag_2$S/AgI, CdS/ZnO, CdS/HgS, CdS/PbS, ZnO/ZnS, ZnO/ZnSe, CdS/HgS, $CdS_x$/$CdSe_{1-x}$, $CdS_x$/$Te_{1-x}$, $CdSe_x$/$Te_{1-x}$, ZnS/CdSe, ZnSe/CdSe, CdS/ZnS, $TO_2$/$Cd_3P_2$, CdS/CdSeCd$_y$Zn$_{1-y}$S, and CdS/HgS/CdS. Other available examples include organic semiconductors such as poly(phenylene vinylene), polythiophene, polyacetylene, tetracene, pentacene, and phthalocyanine.

The semiconductor 3 may be an organic compound having a redox moiety capable of repeated oxidation-reduction as a component of the molecule and having, as another component, a moiety to be swollen to form a gel by containing an electrolyte solution.

The organic compound used in the semiconductor 3 will now be specifically described. The organic compound has a redox moiety capable of repeated oxidation-reduction as a component of the molecule and has, as another component, a moiety (hereinafter called gel moiety) to be swollen to form a gel by containing an electrolyte solution. The redox moiety is chemically bonded to the gel moiety. The positional relation between the redox moiety and the gel moiety in the molecule is not particularly limited. For example, in a molecule having the gel moiety that constitutes a molecular framework such as a main chain, the redox moiety is a side chain that is bonded to the main chain. The molecule may include a structure where a molecular framework forming the gel moiety is alternately bonded to a molecular framework forming the redox moiety.

The oxidation-reduction (oxidation-reduction reaction) means that an ion, an atom, or a compound donates and accepts electrons. The redox moiety is a site capable of stably donating and accepting electrons by an oxidation-reduction reaction (redox reaction).

The organic compound has the redox moiety and forms the semiconductor 3 in a state where the organic compound is swollen with an electrolyte solution. In other words, the organic compound in a gel state has a steric network structure and the network structure is filled with a liquid.

The organic compound having the redox moiety and the gel moiety may have a low molecular weight or a high molecular weight. An available organic compound having a low molecular weight may be an organic compound that forms what is called a low molecular weight gel through a hydrogen bond or the like. For the organic compound having a high molecular weight, an organic compound having a number average molecular weight of 1,000 or more is preferred because such an organic compound can exhibit gelling property spontaneously. The upper limit of the molecular weight of the organic compound having a high molecular weight is not particularly limited and is preferably 1,000,000 or less. The gel state preferably has, for example, a konjac jelly-like appearance or an ion exchange film-like appearance but the gel state is not necessarily to them.

The "redox moiety capable of repeated oxidation-reduction" means a moiety that is reversibly converted into an oxidized form and a reduced form by an oxidation-reduction reaction. The redox moiety is preferably an oxidation-reduction component in which the oxidized form and the reduced form have the same charge.

The aforementioned organic compound having the redox moiety and gel moiety in one molecule can be represented by the general formula below (1).

$$(X_i)_{nj} \cdot Y_k \quad (1)$$

Each of $(X_i)_n$ and $(X_i)_{nj}$, represents the gel moiety, "$X_i$" represents a monomer of a compound constituting the gel moiety, and the gel moiety can be formed of a polymer framework. The degree "n" of polymerization with regard to a monomer preferably ranges from 1 to 100,000. "Y" represents the redox moiety bonded to "X". Moreover, "j" and "k" are arbitrary integers representing the numbers of $(X_i)_n$ and "Y" in one molecule, respectively, and each preferably ranges from 1 to 100,000. The redox moiety "Y" may be bonded to any position in the polymer framework constituting the gel moieties $(X_i)_n$ and $(X_i)_{nj}$. "Y" (the redox moiety) can represent various materials in the same molecule, and the various materials in the molecule preferably have oxidation-reduction potentials, which are close to each other, from the viewpoint of electron exchange reaction.

Examples of the organic compound having the redox moiety and the gel moiety in one molecule and serving as the electron transport layer 1 include a polymer having a quinone derivative framework obtained by chemically bonded quinones, a polymer having an imide derivative framework containing imides, a polymer having a phenoxyl derivative framework containing phenoxyls, and a polymer having a viologen derivative framework containing viologens. In these organic compounds, each polymer framework serves as the gel moiety and each of the quinone derivative framework, the imide derivative framework, the phenoxyl derivative framework, and the viologen derivative framework serves as the redox moiety.

Among these organic compounds, examples of the polymer having a quinone derivative framework obtained by chemically bonded quinones include polymers having chemical structures represented by [Chemical Formula 1] to [Chemical Formula 4]. In [Chemical Formula 1] to [Chemical Formula 4], each of "R"s is saturated or unsaturated hydrocarbons such as methylene, ethylene, propane-1,3-dienyl, ethylidene, propane-2,2-diyl, alkanediyl, benzylidene, propylene, vinylidene, propene-1,3-diyl, and but-1-ene-1,4-diyl; cyclic hydrocarbons such as cyclohexanediyl, cyclohexenediyl, cyclohexadienediyl, phenylene, naphthalene, and biphenylene; keto and divalent acyl groups such as oxalyl, malonyl, succinyl, glutaryl, adipoyl, alkanedioyl, sebacoyl, fumaroyl, maleoyl, phthaloyl, isophthaloyl, and terephthaloyl; ethers and esters such as oxy, oxymethylenoxy, and oxycarbonyl; sulfur-containing groups such as sulfanediyl, sulfanil, and sulfonyl; nitrogen-containing groups such as imino, nitrilo, hydrazo, azo, azino, diazoamino, urylene, and amide; silicon-containing groups such as silanediyl and disilane-1,2-diyl; or groups formed by substituting the terminal thereof and composite groups thereof.

[Chemical Formula 1] is an example of the organic compound including a polymer main chain to which an anthraquinone is chemically bonded. [Chemical Formula 2] is an example of the organic compound including a polymer main chain into which an anthraquinone is integrated as a repeated unit. [Chemical Formula 3] is an example of the organic compound including an anthraquinone as a cross-linking unit. [Chemical Formula 4] is an example of the anthraquinone having a proton donating group that forms an intermolecular hydrogen bond together with an oxygen atom.

[Chemical Formula 1]

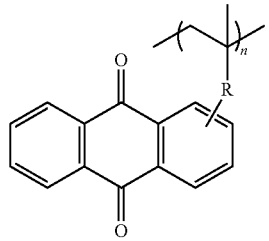

[Chemical Formula 2]

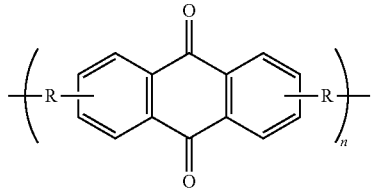

[Chemical Formula 3]

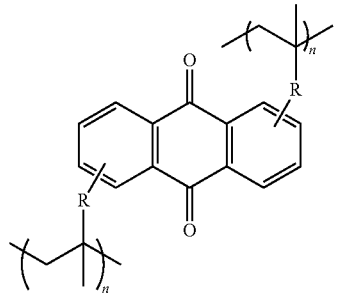

[Chemical Formula 4]

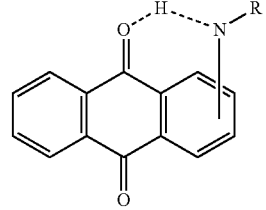

The polymer having an imide derivative framework including an imide as the redox moiety "Y" may be polyimides represented by [Chemical Formula 5] and [Chemical Formula 6]. In [Chemical Formula 5] and [Chemical Formula 6], each of $R_1$ to $R_3$ is an aromatic group such as a phenylene group, an aliphatic chain such as an alkylene group and an alkyl ether, or an ether group. The polyimide polymer framework may be cross-linked at the sites of $R_1$ to $R_3$ and may have no cross-linked structure as long as the polyimide polymer framework is merely swollen and is not dissolved in a solvent used. In a cross-linked polymer, the cross-linked moiety corresponds to the gel moieties $(X_i)_n$ and $(X_i)_{nj}$. In a polyimide polymer framework with a cross-linked structure, the cross-linking unit may contain an imido group. A suitably used imido group is exemplified by phthalimide and pyromellitimide having electrochemically reversible oxidation-reduction properties.

[Chemical Formula 5]

[Chemical Formula 6]

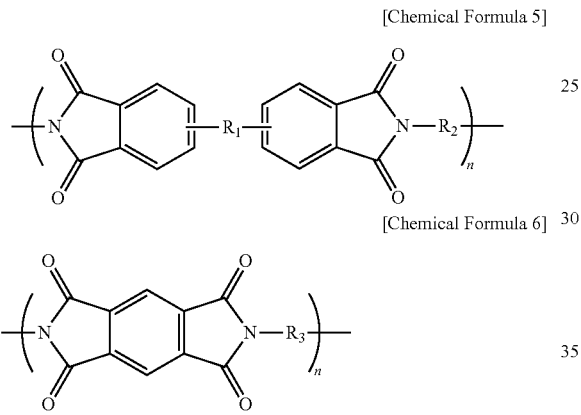

Examples of the polymer having a phenoxyl derivative framework containing phenoxyls include a galvi compound (galvi polymer) as represented by [Chemical Formula 7]. In the galvi compound, the galvinoxyl group (see, [Chemical Formula 8]) corresponds to the redox moiety "Y", and the polymer framework corresponds to the gel moieties $(X_i)_n$ and $(X_i)_{nj}$.

[Chemical Formula 7]

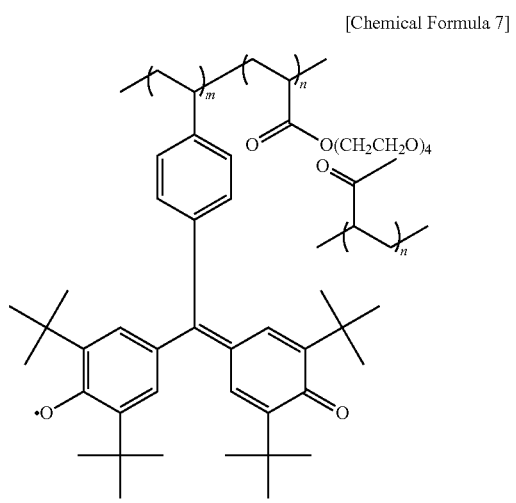

-continued

[Chemical Formula 8]

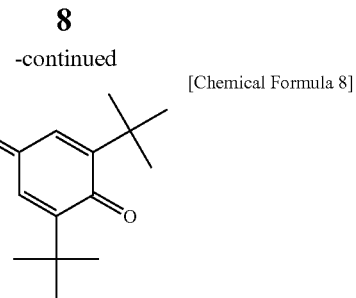

Examples of the polymer having a viologen derivative framework containing viologens include polyviologens as represented by [Chemical Formula 9] and [Chemical Formula 10]. In the polyviologen polymer, the moiety represented by [Chemical Formula 11] corresponds to the redox moiety "Y", and the polymer framework corresponds to the gel moieties $(X_i)_n$ and $(X)_{nj}$.

[Chemical Formula 9]

[Chemical Formula 10]

[Chemical Formula 11]

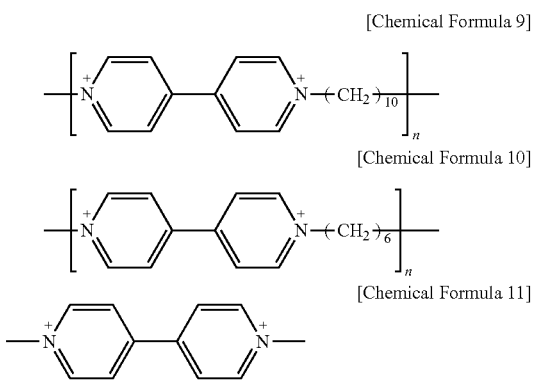

In [Chemical Formula 1] to [Chemical Formula 3], [Chemical Formula 5] to [Chemical Formula 7], [Chemical Formula 9], and [Chemical Formula 10], each of "m" and "n" denotes the degree of polymerization of a monomer and preferably ranges from 1 to 100,000.

As described above, the organic compound, which has a redox moiety and a polymer framework, is swollen by containing an electrolyte solution in a space in the polymer framework, thereby making the semiconductor 3 to be gelated to form a gel layer. By containing an electrolyte solution in a polymer framework in this manner, a counter ion in the electrolyte solution can support an ionic state formed by an oxidation-reduction reaction of the redox moiety, thereby stabilizing the redox moiety. Examples of the electrolyte solution include electrolyte solutions contained in the hole transport layer described later.

Among the semiconductor 3, $TiO_2$ is preferred because $TiO_2$ can avoid photodissolution in an electrolyte solution contained in the first charge-transport layer 5 and can achieve high photoelectric conversion properties.

The layer of the semiconductor 3 formed on the surface of the first electrode 1 preferably has a thickness in a range from 0.01 μm to 100 μm. The thickness within the range can achieve sufficient photovoltaic conversion effect and can eliminate the possibility of lowering the transmittance of visible light and near infrared light. The semiconductor 3 more preferably has a thickness ranging from 0.5 to 50 μm and particularly preferably ranging from 1 to 20 μm.

For the semiconductor 3 made of an inorganic compound, the layer of the semiconductor 3 can be formed by applying a mixed solution of a semiconductor and a binder onto a surface of the first electrode 1 by a known method such as coating with, for example, a doctor blade or a bar coater, spraying, dip coating, screen printing, and spin coating and then removing the binder component by heat burning, pressurization with a press machine, or other means.

The semiconductor 3 made of an inorganic compound preferably has a surface roughness of 10 or more in terms of effective area/projected area. A surface roughness of 10 or more can increase the surface area of a charge separation interface, thereby improving the photoelectric conversion properties. The surface roughness more preferably falls within a range of 100 to 2,000.

For the semiconductor 3 made of an organic compound, the layer of the semiconductor 3 is preferably formed by a wet formation method of applying a solution or the like because such a formation method is simpler and more inexpensive. Especially for a semiconductor 3 containing what is called a high molecular weight organic compound having a number average molecular weight of 1,000 or more, the wet formation method is preferred from the viewpoint of formability. Examples of the wet process include spin coating, drop casting in which a liquid is dropped and dried, and printing such as screen printing and gravure printing. In addition, vacuum processes such as sputtering and depositing can be employed.

On the surface of the semiconductor 3 formed as above, a photosensitizer 4 is carried. In such a structure, the photosensitizer 4 can form the interface for photocharge separation, thereby improving the photoelectric conversion efficiency.

Examples of such a photosensitizer 4 includes conventional materials, for example, inorganic materials (e.g., semiconductor ultrafine particles), and organic materials (e.g., a dye and a pigment). Among them, the photosensitizer 4 is preferably a dye in view of efficiency in absorption of light and in separation of charges. Examples of such a dye include a 9-phenylxanthene dye, a coumarin dye, an acridine dye, a triphenylmethane dye, a tetraphenylmethane dye, a quinone dye, an azo dye, an indigo dye, a cyanine dye, a merocyanine dye, and a xanthene dye. Additional examples include a $RuL_2(H_2O)_2$ type ruthenium-cis-diaqua-bipyridyl complex (where L is 4,4'-dicarboxyl-2,2'-bipyridine), transition-metal complexes such as ruthenium-tris ($RuL_3$), ruthenium-bis ($RuL_2$), osmium-tris ($OsL_3$), and osmium-bis ($OsL_2$), zinc-tetra(4-carboxyphenyl)porphyrin, an iron-hexacyanide complex, and phthalocyanine. Other applicable examples include dyes described in the chapter, DSSC, in "Advanced technology and Material Development of FPD, DSSC, Optical Memory, and Functional Dye" (NTS Inc.). Among them, a dye, which can exhibit an associative property on the semiconductor 3, is preferable because the dye is closely packed and covers the surface of the semiconductor 3 so as to serve as an insulator layer. A photosensitizer 4 serving as the insulator layer can impart rectification to generated electrons at a charge separation interface and thus can suppress the recombination of charges after charge separation. Such a photosensitizer can greatly reduce the number of recombination points for electrons and holes present in the electron transport material and the hole transport material. Therefore, such a photosensitizer can further improve the conversion efficiency of the photoelectric element to be obtained.

The dye forming association to exhibit the effect is preferably a dye having the structure represented by [Chemical Formula 12] and specifically preferably a dye having the structure represented by [Chemical Formula 13]. The associative property can be verified by comparing the absorption spectrum shape of a dye in a state to be dissolved in an organic solvent or other mediums and the absorption spectrum shape of a dye in a state to be carried on the semiconductor 3. It is known that association largely changes the spectrum shape between a dye in the former state and that in the latter state.

[Chemical Formula 12]

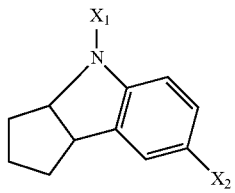

In the formula, each of $X_1$ and $X_2$ includes at least one of an alkyl group, an alkenyl group, an aralkyl group, an aryl group, and a hetero ring, each optionally having a substituent. $X_2$ has a site to adsorb a semiconductor, such as a carboxyl group, a sulfonyl group, and a phosphonyl group.

[Chemical Formula 13]

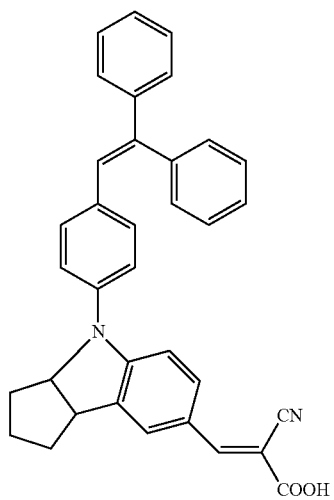

Examples of the semiconductor ultrafine particles for the photosensitizer 4 include sulfide semiconductors such as cadmium sulfide, lead sulfide, and silver sulfide. The semiconductor ultrafine particles may have any particle size as long as such particles have photosensitization effect on the semiconductor 3 in accordance with the present invention, but preferably have a particle size ranging from 1 to 10 nm.

Examples of the method of carrying the photosensitizer 4 on the semiconductor 3 include a method of immersing, into a solution where the photosensitizer 4 is dissolved or dispersed, the substrate having the first electrode 1 on which the semiconductor 3 is attached. The solution may contain any solvent capable of dissolving the photosensitizer 4, such as water, alcohol, toluene, and dimethylformamide. During immersing the semiconductor 3 in a photosensitizer solution for a predetermined period, the solution may be heated and refluxed or be sonicated. After the method of carrying photosensitizer 4 is performed, the substrate is preferably washed or heated and refluxed with an alcohol in order to remove remaining photosensitizer 4, which is not carried.

The amount of the photosensitizer 4 carried on the semiconductor 3 may range from $1 \times 10^{-10}$ to $1 \times 10^{-4}$ mol/cm$^2$ and particularly preferably ranges from $0.1 \times 10^{-8}$ to $9.0 \times 10^{-6}$ mol/cm$^2$ because the photosensitizer 4 in an amount within the range can economically and sufficiently improve the photoelectric conversion efficiency.

The first charge-transport layer 5 and the second charge-transport layer 6 include different oxidation-reduction materials. For example, each of the first charge-transport layer 5 and the second charge-transport layer 6 may contain an electrolyte. When the first charge-transport layer 5 and the second charge-transport layer 6 contain electrolytes, these electrolytes are supporting salts and/or pairs of oxidation-reduction components each including an oxidized form and a reduced form. Examples of the supporting salt (supporting electrolyte) include ammonium salts such as tetrabutylammonium perchlorate and tetraethylammonium hexafluorophosphate, imidazolium salts, pyridinium salts, and alkali metal salts such as lithium perchlorate and potassium tetrafluoroborate. The oxidation-reduction component means a pair of substances reversibly converted into an oxidized form and a reduced form by an oxidation-reduction reaction. Examples of such an oxidation-reduction component include, but are not limited to, a chlorine compound/chlorine, an iodine compound/iodine, a bromine compound/bromine, a thallium ion (III)/a thallium ion (I), a mercury ion (II)/a mercury ion (I), a ruthenium ion (III)/a ruthenium ion (II), a copper ion (II)/a copper ion (I), an iron ion (III)/an iron ion (II), a nickel ion (II)/a nickel ion (III), a vanadium ion (III)/a vanadium ion (II), and a manganate ion/a permanganate ion. When the first charge-transport layer 5 and the second charge-transport layer 6 contain these electrolytes above, the oxidation-reduction component serves independent of the redox moiety of an organic compound included in the semiconductor 3. The electrolyte solution may be in a gel form or in an immobilized form.

The solvent used for dissolving an electrolyte contained in each of the first charge-transport layer 5 and the second charge-transport layer 6 is preferably a compound in which an oxidation-reduction component dissolves so as to exhibit excellent ionic conductivity. The solvent may be an aqueous solvent or an organic solvent and is preferably an organic solvent in order to further stabilize the component. Examples of such an organic solvent include carbonate compounds such as dimethyl carbonate, diethyl carbonate, methyl ethyl carbonate, ethylene carbonate, and propylene carbonate; ester compounds such as methyl acetate, methyl propionate, and γ-butyrolactone; ether compounds such as diethyl ether, 1,2-dimethoxyethane, 1,3-dioxolane, tetrahydrofuran, and 2-methyltetrahydrofuran; heterocyclic compounds such as 3-methyl-2-oxazolidinone and 2-methylpyrrolidone; nitrile compounds such as acetonitrile, methoxyacetonitrile, and propionitrile; and aprotic polar compounds such as sulfolane, dimethylsulfoxide, and dimethylformamide. These solvents may be used singly or in combination as a mixture of two or more of them. Among them, carbonate compounds such as ethylene carbonate and propylene carbonate; heterocyclic compounds such as γ-butyrolactone, 3-methyl-2-oxazolidinone, and 2-methylpyrrolidone; and nitrile compounds such as acetonitrile, methoxyacetonitrile, propionitrile, 3-methoxypropionitrile, and valeronitrile are preferred. The first charge-transport layer 5 and the second charge-transport layer 6 containing an ionic liquid are effective in providing nonvolatility and flame retardancy. In such a case, examples of the ionic liquid include known, general ionic liquids such as an imidazolium ionic liquid, a pyridine ionic liquid, an alicyclic amine ionic liquid, an aliphatic amine ionic liquid, an azonium amine ionic liquid, and ionic liquids having structures described in European Patent No. 718288, specification; International Publication WO 95/18456, pamphlet; Denkikagaku, Vol. 65, No. 11, p. 923 (1997); J. Electrochem. Soc., Vol. 143, No. 10, p. 3099 (1996); and Inorg. Chem., Vol. 35, p. 1168 (1996).

Each of the first charge-transport layer 5 and the second charge-transport layer 6 can also contain a gel electrolyte or a polymer electrolyte. Examples of a gelling agent include a polymer, a gelling agent causing a polymer cross-linking reaction or other, a gelling agent including a multifunctional monomer capable of polymerization, and an oil gelling agent. The gel electrolyte or the polymer electrolyte may be a commonly used electrolyte. Preferred examples of the gel electrolyte and the polymer electrolyte include vinylidene fluoride polymers such as polyvinylidene fluoride, acrylic acid polymers such as polyacrylic acid, acrylonitrile polymers such as polyacrylonitrile, and polyether polymers such as polyethylene oxide, and a compound having an amide structure in the molecular structure.

Solvents of these the first charge-transport layer 5 and the second charge-transport layer 6 preferably have the same composition. The solvents have the same composition, thereby preventing a problem, which otherwise occur due to admixture of the solvents. Therefore, it is possible to obtain the element having excellent durability.

The present embodiment is characterized in that, with regard to the oxidation-reduction materials contained in the first charge-transport layer 5 and the second charge-transport layer 6, an oxidation-reduction potential of the oxidation-reduction material in the first charge-transport layer 5 is higher than an oxidation-reduction potential of the oxidation-reduction material in the second charge-transport layer 6. Such a conformation can improves efficiency in injection of holes from the first charge-transport layer 5 into the second charge-transport layer 6, thereby improving rectification of the element. In other words, electron-transfer to the second charge-transport layer 6 from the first charge-transport layer 5, which causes a drop in the properties of the element, is suppressed.

Moreover, the oxidation-reduction potential of the oxidation-reduction material in the first charge-transport layer 5 is higher than the oxidation-reduction potential of the oxidation-reduction material in the second charge-transport layer 6 by 60 mV or more. In this case, the aforementioned effect is remarkably exhibited and the properties of the element can be improved. If a difference between the oxidation-reduction potential of the oxidation-reduction material in the first charge-transport layer 5 and the oxidation-reduction potential of the oxidation-reduction material in the second charge-transport layer 6 is 60 mV, stabilities of oxidized forms of the oxidation-reduction materials in the first charge-transport layer 5 and the second charge-transport layer 6 differ by a factor of 10 or more. Note that, the difference between the oxidation-reduction potentials of the oxidation-reduction materials in the first charge-transport layer 5 and the second charge-transport layer 6 is not limited, but is preferably not more than 600 mV.

In an embodiment, the oxidation-reduction material in the second charge-transport layer 6 preferably contains an oxidized state. When the oxidation-reduction material in the second charge-transport layer 6 is an oxidized form, the aforementioned effect is remarkably exhibited and the second charge-transport layer 6 can more efficiently extract electrons from the second electrode 2.

Examples of the oxidation-reduction component contained in the first charge-transport layer 5 and the second charge-transport layer 6 include a solution dissolving a redox couple in a solvent, a solid electrolyte (e.g., a molten salt), a p-type semiconductor (e.g., copper iodide), an amine derivative (e.g., triphenylamine), and an electrically conductive polymer such as polyacetylene, polyaniline, and polythiophene.

Each of the first charge-transport layer 5 and the second charge-transport layer 6 may contain a stable radical compound. Each of the first charge-transport layer 5 and the second charge-transport layer 6 containing the stable radical compound enables generated holes to be transported efficiently to the opposite electrode by a very rapid electron transfer reaction of the stable radical compound, and therefore can improve the conversion efficiency.

As the stable radical compound, a chemical species having an unpaired electron, that is to say, a compound having a radical can be used without particular limitation.

As the stable radical compound, a radical compound having nitroxide (NO.) in the molecule is preferred. In order to improve the stability of the element, the stable radical compound preferably has a molecular weight (number average molecular weight) of 1,000 or more because such a compound is solid or is likely to be solid at ambient temperature and thus is unlikely to volatilize.

The stable radical compound will be further described. The stable radical compound is a compound that forms a radical compound in at least one process of an electrochemical oxidation reaction and an electrochemical reduction reaction. The type of the stable radical compound is not particularly limited to one but is preferably a radical compound, which is stable. In particular, the radical compound is preferably an organic compound containing one or both of the structural units of [Chemical Formula 14] and [Chemical Formula 15] below.

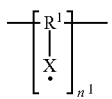

[Chemical Formula 14]

In [Chemical Formula 14], the substituent $R^1$ is a substituted or unsubstituted C2 to C30 alkylene group, C2 to C30 alkenylene group, or C4 to C30 arylene group; "X" is preferably a nitroxide radical group as well as an oxy radical group, a sulfur radical group, a hydrazyl radical group, a carbon radical group, or a boron radical group; and "$n^1$" is an integer of 2 or more.

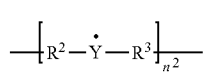

[Chemical Formula 15]

In [Chemical Formula 15], each of the substituents $R^2$ and $R^3$ is independently a substituted or unsubstituted C2 to C30 alkylene group, C2 to C30 alkenylene group, or C4 to C30 arylene group; "Y" is a nitroxide radical group, a sulfur radical group, a hydrazyl radical group, or a carbon radical group; and "$n^2$" is an integer of 2 or more.

Examples of the stable radical compound containing at least one of the structural units represented by [Chemical Formula 13] and [Chemical Formula 14] include an oxy radical compound, a nitroxide radical compound, a carbon radical compound, a nitrogen radical compound, a boron radical compound, and a sulfur radical compound.

Specific examples of the oxy radical compound include aryloxy radical compounds represented by [Chemical Formula 16] and [Chemical Formula 17] and semiquinone radical compounds represented by [Chemical Formula 18].

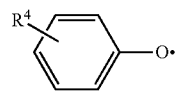

[Chemical Formula 16]

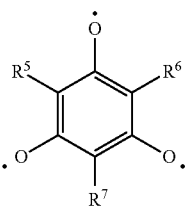

[Chemical Formula 17]

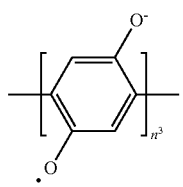

[Chemical Formula 18]

In [Chemical Formula 16] to [Chemical Formula 18], each of the substituents $R^4$ to $R^7$ is independently a hydrogen atom, a substituted or unsubstituted, aliphatic or aromatic C1 to C30 hydrocarbon group, a halogen group, a hydroxyl group, a nitro group, a nitroso group, a cyano group, an alkoxy group, an aryloxy group, or an acyl group.

Specific examples of the nitroxide radical compound include a radical compound having a piperidinoxy ring represented by [Chemical Formula 19], a radical compound having a pyrrolidinoxy ring represented by [Chemical Formula 20], a radical compound having a pyrrolinoxy ring represented by [Chemical Formula 21], and a stable radical compound having a nitronyl nitroxide structure represented by [Chemical Formula 22].

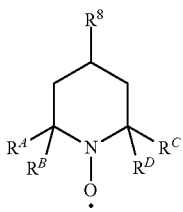

[Chemical Formula 19]

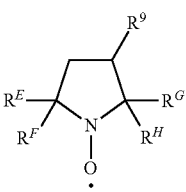

[Chemical Formula 20]

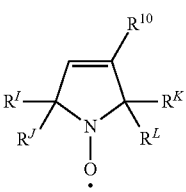

[Chemical Formula 21]

-continued

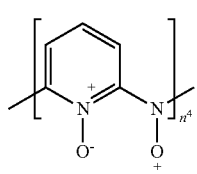
[Chemical Formula 22]

In [Chemical Formula 19] to [Chemical Formula 22], each of $R^8$ to $R^{10}$ and $R^A$ to $R^L$ is independently a hydrogen atom, a substituted or unsubstituted, aliphatic or aromatic C1 to C30 hydrocarbon group, a halogen group, a hydroxyl group, a nitro group, a nitroso group, a cyano group, an alkoxy group, an aryloxy group, or an acyl group. In the chemical formula [Chemical Formula 22], "$n^4$" is an integer of 2 or more.

Specific examples of the nitrogen radical compound include a radical compound having a trivalent hydrazyl group represented by [Chemical Formula 23], a radical compound having a trivalent verdazyl group represented by [Chemical Formula 24], and a radical compound having an aminotriazine structure represented by [Chemical Formula 25].

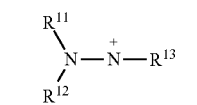
[Chemical Formula 23]

[Chemical Formula 24]

[Chemical Formula 25]

In [Chemical Formula 23] to [Chemical Formula 25], each of $R^{11}$ to $R^{19}$ is independently a hydrogen atom, a substituted or unsubstituted, aliphatic or aromatic C1 to C30 hydrocarbon group, a halogen group, a hydroxyl group, a nitro group, a nitroso group, a cyano group, an alkoxy group, an aryloxy group, or an acyl group.

Any of the organic polymer compounds represented by [Chemical Formula 14] to [Chemical Formula 25] is excellent in stability. As a result, the photoelectric element can stably work as a photoelectric conversion element or an energy storage element, and a photoelectric element having excellent stability and excellent response speed can be readily obtained.

Furthermore, it is preferable to use the stable radical compound that is in a solid state at room temperature. Such a radical compound can be stably in contact with the semiconductor 3 and thus suppress reforming and deterioration due to a side reaction with other chemical substances, melting, or diffusion. As a result, a photoelectric element having excellent stability can be obtained.

Moreover, preferred examples of the organic compound that is polymer specifically include a compound (nitroxy radical polymer) represented by [Chemical Formula 26] to [Chemical Formula 29].

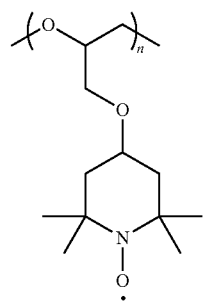
[Chemical Formula 26]

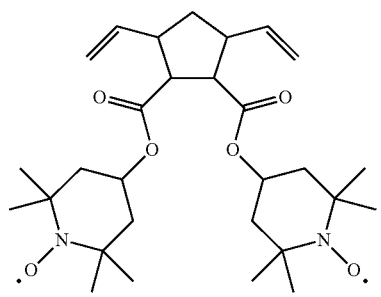
[Chemical Formula 27]

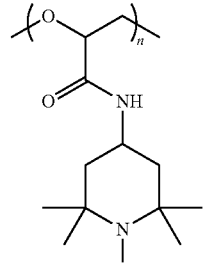
[Chemical Formula 28]

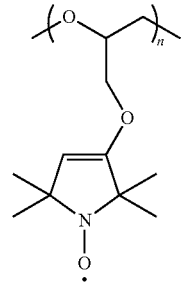
[Chemical Formula 29]

In each of [Chemical Formula 26] to [Chemical Formula 29], "n" denotes the degree of polymerization of a monomer, and preferably ranges from 1 to 100,000.

As described above, the organic compound having a redox moiety and a polymer framework swells when spaces in the polymer framework are filled with electrolyte solutions, and therefore forms a gel layer. By containing an electrolyte solution in the first charge-transport layer 5 and the second charge-transport layer 6 in this manner, a counter ion in the electrolyte solution support an ionic state formed by an oxidation-reduction reaction of the redox moiety. Therefore, the redox moiety is stabilized.

Moreover, a gel electrolyte or a polymer electrolyte is can be used as the organic compound. Examples of a gelling agent include a polymer, a gelling agent causing gellation by means of a polymer cross-linking reaction or the like, a gelling agent containing a polymerizable multifunctional monomer, and an oil gelling agent. The gel electrolyte or the polymer electrolyte may be a commonly used electrolyte. Preferred examples of the gel electrolyte and the polymer electrolyte include vinylidene fluoride polymers such as polyvinylidene fluoride, acrylic acid polymers such as polyacrylic acid, acrylonitrile polymers such as polyacrylonitrile, and polyether polymers such as polyethylene oxide, and a compound having an amide structure in the molecular structure.

The electrolyte solution suffices to contain an electrolyte and a solvent. As the electrolyte, for example, one or both of a supporting salt and an oxidation-reduction component including an oxidized form and a reduced form is used. Examples of the supporting salt (supporting electrolyte) include ammonium salts such as tetrabutylammonium perchlorate and tetraethylammonium hexafluorophosphate, imidazolium salts, pyridinium salts, and alkali metal salts such as lithium perchlorate and potassium tetrafluoroborate. The oxidation-reduction component means a pair of substances reversibly converted into an oxidized form and a reduced form by an oxidation-reduction reaction. Examples of such an oxidation-reduction component include, but are not limited to, a chlorine compound/chlorine, an iodine compound/iodine, a bromine compound/bromine, a thallium ion (III)/a thallium ion (I), a mercury ion (II)/a mercury ion (I), a ruthenium ion (III)/a ruthenium ion (II), a copper ion (II)/a copper ion (I), an iron ion (III)/an iron ion (II), a nickel ion (II)/a nickel ion (III), a vanadium ion (III)/a vanadium ion (II), and a manganate ion/a permanganate ion.

Examples of the solvent for the electrolyte solution include solvents containing at least one of water, an organic solvent, and an ionic liquid. When water or an organic solvent is used as the solvent for the electrolyte solution, a reduction state of the redox moiety in the organic compound is stabilized and transportation of electron is more stabilized. As the solvent, either of an aqueous solvent and an organic solvent is used, but the organic solvent is preferable because it has excellent ionic conductivity. Examples of such an organic solvent include carbonate compounds such as dimethyl carbonate, diethyl carbonate, methyl ethyl carbonate, ethylene carbonate, and propylene carbonate; ester compounds such as methyl acetate, methyl propionate, and γ-butyrolactone; ether compounds such as diethyl ether, 1,2-dimethoxyethane, 1,3-dioxolane, tetrahydrofuran, and 2-methyltetrahydrofuran; heterocyclic compounds such as 3-methyl-2-oxazolidinone and 2-methylpyrrolidone; nitrile compounds such as acetonitrile, methoxyacetonitrile, and propionitrile; and aprotic polar compounds such as sulfolane, dimethylsulfoxide, and dimethylformamide. Each of these solvents may be used alone, or these solvents are used in combination as a mixture of two or more of them. Among them, in order to use the photoelectric element as a photoelectric conversion element and to improve power output characteristics of the element, carbonate compounds such as ethylene carbonate and propylene carbonate; heterocyclic compounds such as γ-butyrolactone, 3-methyl-2-oxazolidinone, and 2-methylpyrrolidone; and nitrile compounds such as acetonitrile, methoxyacetonitrile, propionitrile, 3-methoxypropionitrile, and valeronitrile are preferred.

An ionic liquid used as a solvent in the electrolyte solution improves stabilizing action for the redox moiety in particular.

In addition, an ionic liquid, which has no volatility and has high flame retardancy, is excellent in stability. Examples of the ionic liquid include known, general ionic liquids such as an imidazolium ionic liquid (e.g., 1-ethyl-3-methylimidazolum tetracyanoborate), a pyridine ionic liquid, an alicyclic amine ionic liquid, an aliphatic amine ionic liquid, an azonium amine ionic liquid, and ionic liquids having structures described in European Patent No. 718288, specification; International Publication WO 95/18456, pamphlet; Denkikagaku, Vol. 65, No. 11, p. 923 (1997); J. Electrochem. Soc., Vol. 143, No. 10, p. 3099 (1996); and Inorg. Chem., Vol. 35, p. 1168 (1996).

Figure 2:
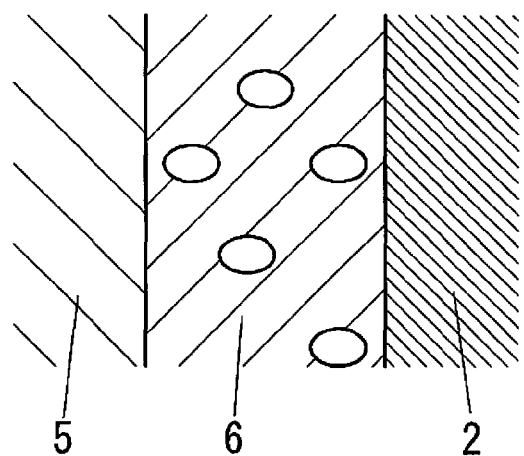
FIG. 2 is a partial schematic cross-sectional view of the above embodiment.

The second charge-transport layer 6 may be present on the second electrode 2 so as to chemically modify the second electrode 2. In this case, adhesiveness between the second charge-transport layer 6 and the second electrode 2 is improved, and therefore it is expected that the separation of the second charge-transport layer 6 caused by longtime use is suppressed. For example, the modification is achieved by chemically bonding by use of a functional group present on the second electrode 2 and a compound 10 having the redox moiety and an anchor group as shown in FIG. 2. Specifically, for example, when the second electrode 2 is made of gold, the oxidation-reduction material (ferrocenyl alkylthiol) having a thiol group as the anchor group as represented by [Chemical Formula 30] can be used.

[Chemical Formula 30]

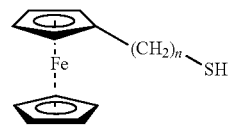

In [Chemical Formula 30], "n" is an integer in a range of 1 to 20.

In a case where the second electrode 2 is made of electrically conductive oxide, an oxidation-reduction material having a carboxyl group, a phosphate group, or an amino group as represented by the following structural formulae in [Chemical formulae 31-1, 31-2, and 31-3] can be used as the second charge-transport layer 6.

[Chemical Formula 31-1]

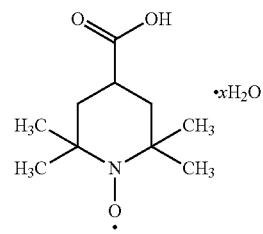

[Chemical Formula 31-2]

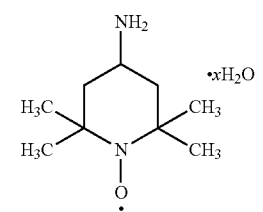

-continued

[Chemical Formula 31-3]

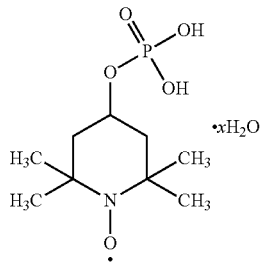

Figure 3:
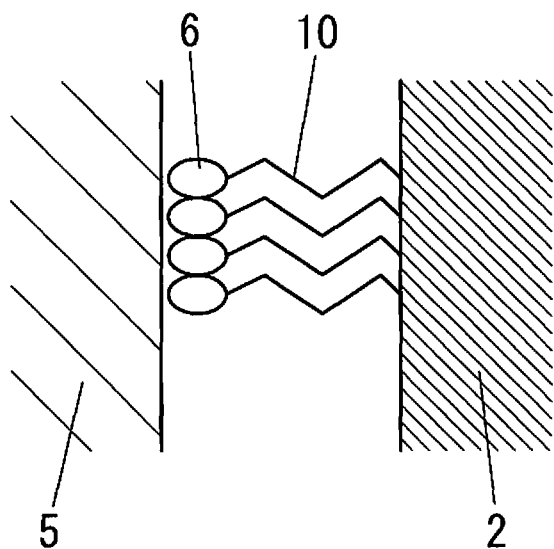
FIG. 3 is a partial schematic cross-sectional view of the above embodiment.

As shown in FIG. 3, the second charge-transport layer 6 is preferably in a form of polymer gel (a gel layer) on a surface of the second electrode 2. In this case, the area of the interface between the second charge-transport layer 6 and the electrolyte solution (electrolytic solution) is sufficiently increased, and therefore the rectification property can be improved. The thickness of the polymer gel preferably falls within a range of 10 nm to 10 μm, and more preferably falls within a range of 100 nm to 1 μm. The thickness within the ranges can provide an increase in the area of the interface between the polymer gel and the electrolytic solution, and the transfer of charges in the film of the polymer gel is less likely to be inhibited. When the polymer gel has a too small thickness, the area of the interface with the electrolytic solution is insufficient and this causes a decrease in the improvement of the rectification property. When the polymer gel has a too large thickness, the supporting electrolyte diffused in the film of the polymer gel acts as a resistance component, and therefore the photoelectric conversion properties are decreased.

Figure 4:
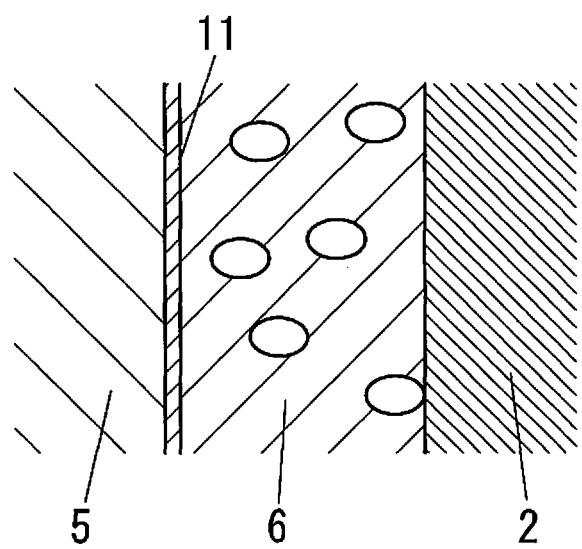
FIG. 4 is a partial schematic cross-sectional view of the above embodiment.

As shown in FIG. 4, the first charge-transport layer 5 and the second charge-transport layer 6 may be isolated from each other with a diaphragm 11. In this case, it is possible to improve material selectivity of the first charge-transport layer 5 and the second charge-transport layer 6. In other words, the second charge-transport layer 6 is disposed on the first charge-transport layer 5 while the diaphragm 11 is interposed between the first charge-transport layer 5 and the second charge-transport layer 6. The diaphragm 11 may be any member so far as it allows electric interaction and prevents the solvents from mixing. Examples of the diaphragm 11 include a porous body, a salt bridge, and an ion exchange film. The porous body is required to have a pore diameter of 10 μm or less in order to prevent the solvents from mixing. Specific examples of the porous body include porous glass and a cellulose film. The salt bridge is, for example, a member that is prepared by dissolving a supporting salt (e.g., KCl) into supporting body (e.g., an agar), which is to be swollen with a solvent, and subsequently by solidifying it. A thickness of the diaphragm 11 is not limited to particular one, but is typically 100 μm or less, and is more preferably 1 μm or less.

Figure 6:
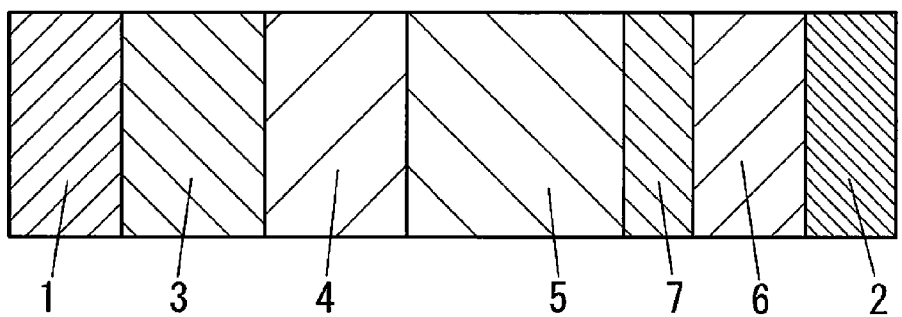
FIG. 6 is a schematic cross-sectional view of another example of the above embodiment.

Further, in the present embodiment, a photoelectrical element that includes three, four, five, or more charge-transport layers can be prepared by adding one or more charge-transport layers to the first charge-transport layer 5 and the second charge-transport layer 6. With providing a plurality of charge-transport layers between the first electrode 1 and the second electrode 2, it is possible to increase both a physical distance between the first electrode 1 and the semiconductor 3 having a charge separation interface and a physical distance between the second electrode 2 and the semiconductor 3. Consequently, the rectification property can be improved and the effect of increasing voltage can be obtained. Specifically, as shown in FIG. 6, a third charge-transport layer 7 may be disposed between the first charge-transport layer 5 and the second charge-transport layer 6 so as to be in contact with both of the first charge-transport layer 5 and the second charge-transport layer 6. The third charge-transport layer 7 is characterized in that the third charge-transport layer 7 has a different oxidation-reduction material from the oxidation-reduction materials in the first charge-transport layer 5 and the second charge-transport layer 6, and that an oxidation-reduction potential of the oxidation-reduction material in the third charge-transport layer 7 is lower than that in the first charge-transport layer 5 and higher than that in the second charge-transport layer 6. The third charge-transport layer 7 can be made of a similar material to those of the first charge-transport layer 5 and the second charge-transport layer 6.

Moreover, a cell in which holes and electrons flow in opposite directions to those of the aforementioned cell in accordance with the present invention (i.e., a so-called p-type sensitized solar cell) can provide similar effects. Such a cell may have similar configuration of elements of the first electrode 1, the second electrode 2, the semiconductor 3, the photosensitizer 4, the first charge-transport layer 5, and the second charge-transport layer 6. However, the cell is required to satisfy a condition where the oxidation-reduction potential of the oxidation-reduction material in the first charge-transport layer 5 is lower than the oxidation-reduction potential of the oxidation-reduction material in the second charge-transport layer 6. In other words, a photoelectric element includes: a first electrode 1; and a second electrode 2 positioned so as to face the first electrode 1; and a semiconductor 3 disposed on a face of the first electrode 1, the face being positioned so as to face the second electrode 2; and a photosensitizer 4 carried on the semiconductor 3; and a first charge-transport layer 5 interposed between the first electrode 1 and the second electrode 2; and a second charge-transport layer 6 interposed between the first charge-transport layer 5 and the second electrode 2. In this element, the first charge-transport layer 5 and the second charge-transport layer 6 contain different oxidation-reduction materials, and the oxidation-reduction material in the first charge-transport layer 5 has an oxidation-reduction potential lower than an oxidation-reduction potential of the oxidation-reduction material in the second charge-transport layer 6. In this case, the semiconductor 3 is preferably a p-type semiconductor. The p-type semiconductor is defined as a semiconductor where the hole is the majority carrier. Examples of the p-type semiconductor include CuO, $Cu_2O$, $CuGaO_2$, $ZnRh_2O_4$, NiO, CoO, $CuAlO_2$, $SrCu_2O_2$, and a semiconductor doped with a dopant.

Figure 5:
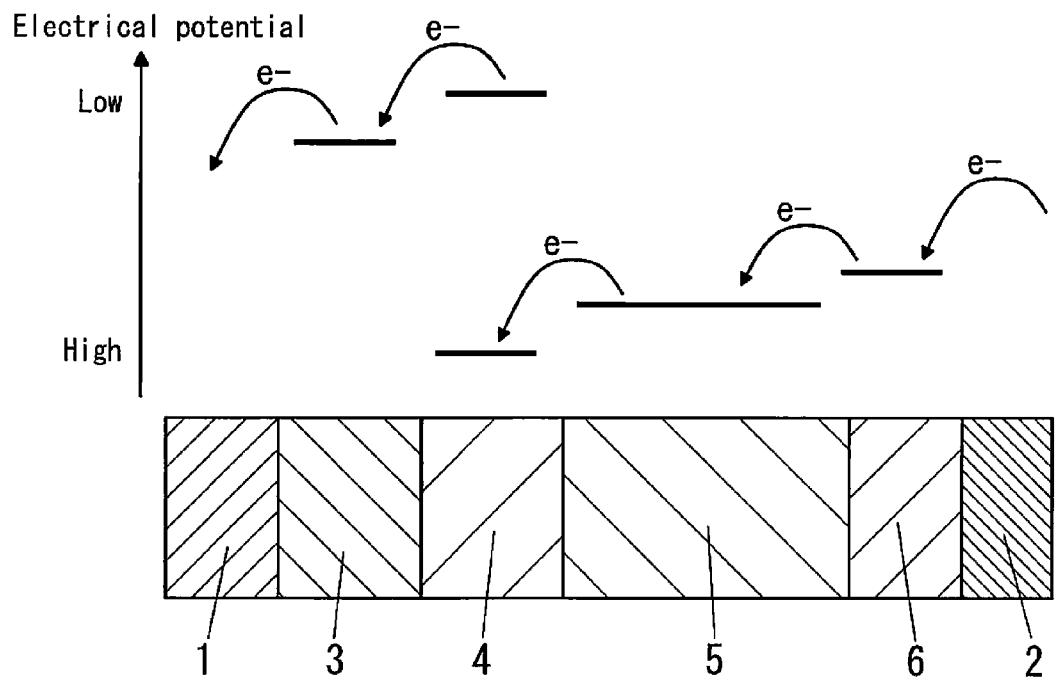
FIG. 5 is a schematic view showing an operation of the above embodiment.

In the photoelectric element formed in the aforementioned manner, when the semiconductor 3 is irradiated, electrons and holes are produced in the semiconductor 3. Thereafter, as shown in FIG. 5, the electrons move to the first electrode 1 and the holes are efficiently transferred through the charge-transport layer 5 and the charge-transport layer 6 and thus reach the second electrode 2. The resultant current can be outputted while the first electrode 1 serves as the negative electrode (anode) and the second electrode 2 serves as the positive electrode (cathode). Moreover, the element includes the first charge-transport layer 5 and the second charge-transport layer 6, and the oxidation-reduction potential of the oxidation-reduction material in the first charge-transport layer 5 is higher than the oxidation-reduction potential of the oxidation-reduction material in the second charge-transport layer 6. Therefore, holes present in the first charge-transport layer 5 are rapidly transferred to the second charge-transport layer 6 and then gathered in the second charge-transport layer 6, and consequently an amount of holes in the first charge-transport layer 5 is reduced. Accordingly, an amount of holes in the first charge-transport layer 5 which react with the first electrode 1 and cause a decrease in voltage is decreased. Hence, the effect of increasing voltage can be obtained. Therefore, recombination of charges at the charge separation interface after charge separation is suppressed, and charge-transport properties of the first charge-transport layer 5 and the second charge-transport layer 6 can be improved. Hence, a photoelectric element with excellent conversion efficiency between light and electricity is obtained.

EXAMPLES

The present invention will be specifically described with reference to the following examples.

Comparative Example 1

A paste for screen printing was prepared by dispersing a high purity titanium oxide powder having an average primary particle diameter of 20 nm into ethyl cellulose. An electrically conductive glass substrate (10 Ω/square, available from ASAHI GLASS CO., LTD) that was provided on a surface with a first electrode made of fluorine-doped $SnO_2$ and had a thickness of 1 mm was used. On the surface of the first electrode formed on the glass substrate, a titanium oxide layer having a thickness of about 10 nm was formed with sputtering. Subsequently, the aforementioned paste was applied onto this layer and dried, and then the dried product was burned at 500° C. for 30 min in the air, and consequently a porous titanium oxide semiconductor film (titanium coat) having a thickness of 2 μm was formed on the first electrode. The surface roughness of this semiconductor was about 250.

Then, the substrate with this titanium oxide semiconductor film was immersed into an acetonitrile-butanol (1:1) mixed solution containing 0.3 mM photosensitive dye ("D131" available from Mitsubishi Paper Mills Ltd.) represented by the [Chemical Formula 13] described above, and subsequently was placed statically in a dark room at room temperature for 16 hours in order to prepare a work electrode by having the semiconductor carry the photosensitizer.

An electrically conductive glass substrate (10 Ω/square, available from ASAHI GLASS CO., LTD.) that was provided on a surface with fluorine-doped $SnO_2$ and had a thickness of 1 mm was prepared, and a second electrode (counter electrode) was formed by providing platinum on the surface of the $SnO_2$ by means of a sputtering method.

Subsequently, a hot-melt adhesive ("Bynel" available from DUPONT-MITSUI POLYCHEMICALS CO., LTD.) as a sealer was disposed on the second electrode so as to surround a corresponding part to the titanium oxide semiconductor layer on the work electrode. Subsequently, the second electrode was overlain with the glass substrate having the work electrode, and they were bonded with each other through heating and pressing. An inlet was formed on the glass substrate having the second electrode with a diamond drill.

Separately, in acetonitrile, TEMPO(2,2,6,6-tetramethylpyperidine 1-oxyl), N-methylbenzimidazole, and lithium perchlorate were dissolved so as to give concentrations of 0.01 mol/l, 0.025 mol/l, and 0.1 mol/l, respectively, to prepare an electrolyte solution. Then, the electrolyte solution was poured through the inlet, and then the inlet was sealed with an IN curing resin. Consequently, a charge-transport layer (the first charge-transport layer) was formed.

A photoelectric element was obtained in the aforementioned manner. Then, upon the photoelectric element, light from a stabilized fluorescent lamp having illuminance of 10001× was applied and current-voltage properties were measured in order to examine conversion efficiency after stabilization. Note that the present measurement environment provides one five-hundredth of the sun light, however, the present invention may be, of course, applied to a use under the sun light and is not limited to one application. Table 1 shows the results.

Example 1

Example 1 was different from Comparative Example 1 in that ITO was used for forming a second electrode and 4-hydroxy-TEMPO phosphate represented by the following structural formula [Chemical Formula 32] was modified to form a second charge-transport layer. A method for forming them will be described hereinafter.

First, ITO was immersed into IPA and washed with ultrasonic wave for 10 min. This second electrode was immersed into 0.01M 4-hydroxy-TEMPO phosphate aqueous solution for a whole day and night to form the second charge-transport layer on the second electrode. CN-TEMPO was used instead of TEMPO dissolved in the electrolytic solution in Comparative Example 1 for forming a charge-transport layer (the first charge-transport layer).

Other components were prepared in similar manners to those for Comparative Example 1 to obtain a photoelectric element.

Note that the oxidation-reduction potential of the oxidation-reduction material in the first charge-transport layer was higher than the oxidation-reduction potential of the oxidation-reduction material in the second charge-transport layer by 60 mV.

[Chemical Formula 32]

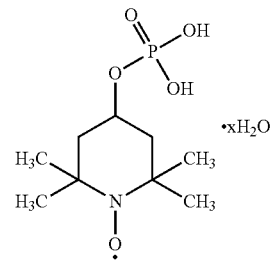

Example 2

Example 2 was different from Comparative Example 1 in that a compound represented by [Chemical Formula 33] was used for forming the second charge transport layer on the second electrode. Furthermore, CN-TEMPO was used instead of TEMPO used in Comparative Example 1. Other components were prepared in similar manners to those for Comparative Example 1 to obtain a photoelectric element.

Note that, the oxidation-reduction potential of the oxidation-reduction material in the first charge-transport layer was higher than the oxidation-reduction potential of the oxidation-reduction material in the second charge-transport layer by 40 mV.

[Chemical Formula 33]

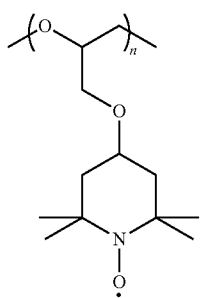

A method for forming the second charge-transport layer will be described hereinafter.

Into 4 mL of 50 wt % sodium hydroxide solution, 2.5 mL (30 mmol) of epichlorohydrin, and 84 mg (239 µmol) of tetrabutylammonium sodium hydrogen sulfate were added, and the thus-obtained solution was stirred. Into the solution, 1.03 g (5.98 mmol) of 4-hydroxy-2,2,6,6-tetramethylpyperidine 1-oxyl was further added and reacted at room temperature for 12 hours. Then, extraction with ether and column chromatography with a mixed solution of hexane/chloroform (1/1 by volume) for purification were performed. Consequently, 1.14 g of 4-glycidyloxy-2,2,6,6-tetramethylpyperidine 1-oxyl was obtained (84% yield).

228 mg (1.00 mmol) of the thus-obtained 4-glycidyloxy-2,2,6,6-tetramethylpyperidine-1-oxyl was reacted in tetrahydrofuran (THF) at 60° C. for 24 hours under a nitrogen atmosphere in the presence of 5.6 mg (0.05 mmol) of potassium tert-butoxide (t-BuOK) as a polymerization initiator. The product was reprecipitated with diethyl ether to be purified. Consequently, poly-((2,2,6,6-tetramethylpyperidine-1-oxyl-oxyl-4-yl)-glycidyl ether) (see, [Chemical Formula 33]) was obtained as orange powder. The obtained polymer had a number average molecular weight of 3,600 (polystyrene equivalent) and a polydispersity index (a weight number average molecular weight/a number average molecular weight) of 1.4 (150 mg, 66% yield).

10 mg of the obtained compound was dissolved in 1 mL of DMF as a solvent, and applied by spin coating to form a second charge-transport layer having a thickness of 100 nm.

Example 3

Example 3 was different from Comparative Example 1 in that a diaphragm was provided with the second charge-transport layer, and that the diaphragm was disposed on a side close to the second electrode of a charge-transport layer (first charge-transport layer). Furthermore, CN-TEMPO was used instead of TEMPO dissolved in an electrolytic solution in Comparative Example 1 for forming a charge-transport layer (first charge-transport layer). Other components were prepared in similar manners to those for Comparative Example 1 to obtain an element.

Note that, the oxidation-reduction potential of the oxidation-reduction material in the first charge-transport layer was higher than the oxidation-reduction potential of the oxidation-reduction material in the second charge-transport layer by 300 mV.

TABLE 1

|  | Ex. 1 | Ex. 2 | Ex. 3 | Com. Ex. 1 |
|---|---|---|---|---|
| Open-circuit voltage Voc (mV) | 712 | 732 | 770 | 650 |
| Short-circuit current Jsc (µA/cm$^2$) | 13.3 | 14.1 | 3.2 | 13.1 |
| Maximum Power Pmax (µW/cm$^2$) | 6.6 | 7.2 | 1.7 | 5.9 |

The results shown in Table 1 teach that Examples 1 to 3 in which the second charge-transport layer was formed have higher photoelectric conversion efficiency than Comparative Example 1.

(Synthesis of Galvi Monomer)

Into a reaction container, 4-bromo-2,6-di-tert-butylphenol (135.8 g; 0.476 mol) and acetonitrile (270 ml) were added, and in an inert atmosphere, N,O-bis(trimethylsilyl)acetamide (BSA) (106.3 g; 129.6 ml) was further added. The thus-obtained solution was stirred and reacted overnight at 70° C. until a crystal was completely precipitated. The precipitated white crystal was filtered, then was dried under vacuum, and was purified by means of recrystallization in ethanol. Consequently, (4-bromo-2,6-di-tert-butylphenoxy)trimethylsilane (150.0 g; 0.420 mol) represented by sign "1" in [Chemical Formula 25] was obtained as a white plate crystal.

Next, in a reaction container, (4-bromo-2,6-di-tert-butylphenoxy)trimethylsilane (9.83 g; 0.0275 mol) obtained above was dissolved in tetrahydrofuran (200 ml) in an inert atmosphere and the prepared solution was cooled to −78° C. using dry ice/methanol. To the solution in the reaction container, a hexane solution of 1.58 M n-butyllithium (15.8 ml; 0.025 mol) was added and the whole was stirred at a temperature of 78° C. for 30 minutes for lithiation. Then, to the solution, a tetrahydrofuran solution (75 ml) of methyl 4-bromobenzoate (1.08 g; 0.005 mol, Mw: 215.0, TCI) was added and the whole was stirred from −78° C. to room temperature overnight. This changed the solution color from yellow through pale yellow to dark blue that indicates the generation of an anion. After the reaction, to the solution in the reaction container, a saturated aqueous ammonium chloride solution was added until the solution color was completely changed to yellow, and then the solution was extracted with ether/water. Consequently, a product was obtained in a yellow viscous liquid form.

Then, into a reaction container, the product, THF (10 ml), methanol (7.5 ml), and a stirring bar were added, and the product was dissolved. Subsequently, 10 N HCl (1 to 2 ml) was gradually added until the reaction solution was changed to red-orange and the mixture was stirred for 30 minutes at room temperature. Then, the solvents were removed, and the residue was subjected to extraction with ether/water, solvent removal, fractionation by column chromatography (hexane/chloroform=1/1), and recrystallization in hexane to be purified. Consequently, (p-bromophenyl)hydrogalvinoxyl (2.86 g; 0.0049 mol) represented by sign "2" in [Chemical Formula 34] was obtained as an orange crystal.

Next, in a reaction container, (p-bromophenyl)hydrogalvinoxyl (2.50 g; 4.33 mmol) obtained above was dissolved in toluene (21.6 ml; 0.2 M) in an inert atmosphere. To the solution, 2,6-di-tert-butyl-p-cresol (4.76 mg; 0.0216 mmol), tetrakis(triphenylphosphine)palladium(0) (0.150 g; 0.130 mmol), and tri-n-butylvinyltin (1.65 g; 5.20 mmol, Mw: 317.1, TCI) were immediately added, and the mixture was heated and stirred at 100° C. for 17 hours.

The reaction product obtained above was extracted with ether/water, and the solvent was removed. The residue was fractionated by flash column chromatography (hexane/chloroform=1/3) and was further purified by recrystallization in hexane. Consequently, p-hydrogalvinoxylstyrene (1.54 g; 2.93 mmol) represented by sign "3" in [Chemical Formula 34] was obtained as an orange microcrystal.

(Polymerization of Galvi Monomer)

In 2 ml of tetrahydrofuran, 1 g of the galvi monomer (p-hydrogalvinoxylstyrene) obtained in Synthesis of Galvi Monomer above, 57.7 mg of tetraethylene glycol diacrylate, and 15.1 mg of azobisisobutyronitrile were dissolved. Then, the solution was subjected to nitrogen substitution and was refluxed overnight. Consequently, the galvi monomer was polymerized to give a galvi polymer represented by sign "4" in [Chemical Formula 34].

The galvi polymer (represented by sign "4" in [Chemical Formula 34]) was dissolved (dispersed) in chlorobenzene at a ratio of 2% by mass. The solution was applied onto the first electrode (FTO electrode) by spin coating at 1,000 rpm and was dried at 60° C. under 0.01 MPa for 1 hour. Consequently, a semiconductor was formed. A layer thickness of the semiconductor was set to 120 nm.

The semiconductor was immersed in a saturated solution of a sensitizing dye (D131) represented by [Chemical Formula 35] in acetonitrile for 1 hour to carry the photosensitizer.

[Chemical Formula 34]

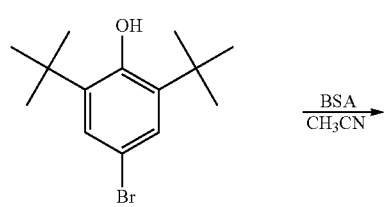

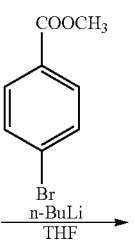

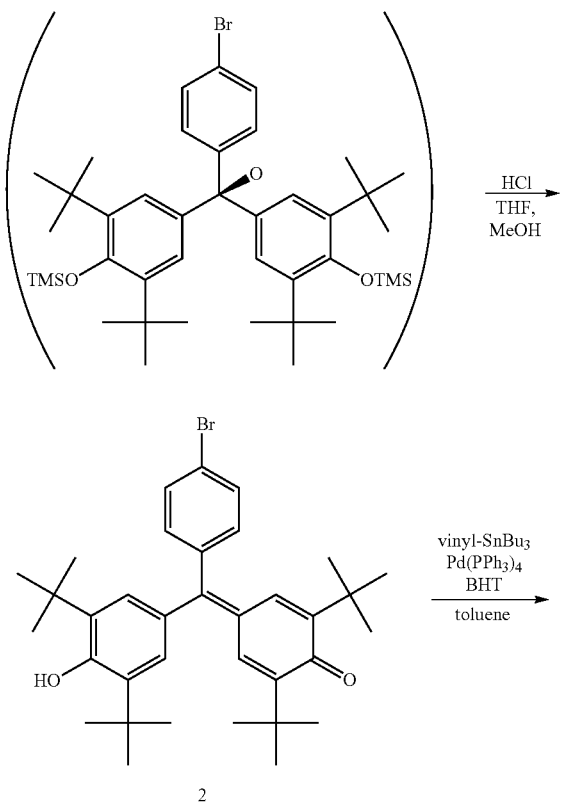

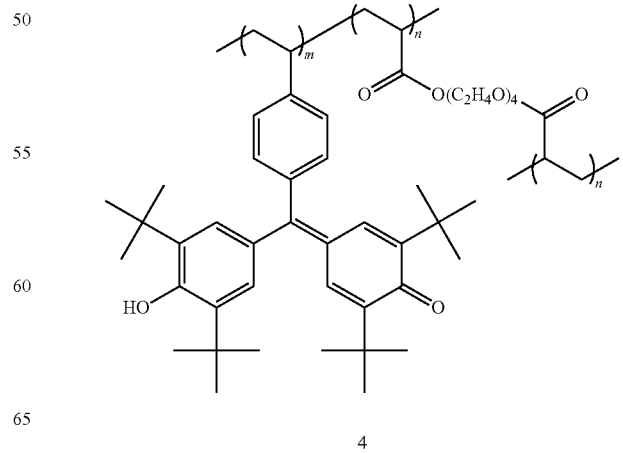

-continued

[Chemical Formula 35]

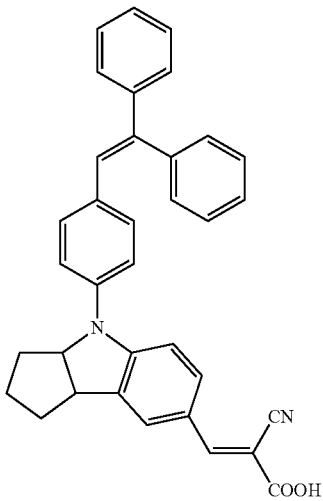

(Production of Element)

An electrically conductive glass substrate having the same structure as that of the electrically conductive glass substrate used for forming the above semiconductor was prepared.

In isopropyl alcohol, chloroplatinic acid was dissolved so as to give a concentration of 5 mM. The obtained solution was applied onto the coating film on the electrically conductive glass substrate by spin coating and then was burned at 400° C. for 30 minutes. Consequently, a second electrode was formed.

Next, the electrically conductive glass substrate with the first electrode on which the semiconductor is formed and the electrically conductive glass substrate with the second electrode were arranged so that the semiconductor and the second electrode faced each other. A hot-melt adhesive (available from DuPont, "Bynel") having a width of 1 mm and a thickness of 50 μm was interposed between the edges of the semiconductor and the second electrode. While the hot-melt adhesive was heated, the electrically conductive glass substrates were pressurized in the thickness direction. Accordingly, the electrically conductive glass substrates were bonded through the hot-melt adhesive. The hot-melt adhesive had an opening as an inlet for an electrolytic solution. Subsequently, the space between the semiconductor and the second electrode was filled with an electrolytic solution through the inlet. Next, the inlet was filled with a UV curing resin and UV light was applied to harden the UV curing resin, thereby closing the inlet. This formed the charge-transport layer (the first charge-transport layer) including the electrolytic solution and concurrently caused the electrolytic solution to penetrate the semiconductor. Consequently, the organic compound (galvi polymer) included in the semiconductor was swollen to form a gel layer. The electrolytic solution used was an acetonitrile solution containing 1 M TEMPO, 2 mM sensitizing dye (D131), 0.5 M LiTFSI, and 1.6 M N-methylbenzimidazole. As a result of these processes described above, a photoelectric conversion element was produced.

Comparative Example 31

A photo absorption material represented by the following structural formula (14) is, for example, produced by a chemical reaction represented by the following [Chemical Formula 36].

For this reaction, 4,4-bipyridyl is added into ethanol and then 2-bromoethyl amine is added into the ethanol. The thus-obtained solution is stirred and mixed overnight at 70° C. to give a compound represented by the structural formula (14)-1 as a yellow solid (59% yield).

Then, into a mixed solution of tetrahydrofuran (THF)/ethanol, the compound represented by the structural formula (14)-1 and a D131 dye are added, and furthermore an ester condensation agent (4-(4,6-dimethoxy-1,3,5-triazin-2-yl)-4-methylmorpholinium chloride; DMT-MM) and a base (triethylamine; TEA) are added. The thus-obtained solution is left at room temperature for 1 hour to give a compound represented by the structural formula (14)-2.

Subsequently, the compound represented by the structural formula (14)-2 is added into ethanol and then an excessive amount of iodomethane is added into the ethanol. The thus-obtained solution is left overnight at 60° C. and thereafter washed with water, and a product is reprecipitated in diethyl ether. Consequently, the photo absorption material represented by the structural formula (14) is obtained as a red-brown solid (65% yield). The photo absorption material represented by the structural formula (14) is soluble in chloroform, acetonitrile, and methanol and insoluble in water. The photo absorption material represented by the structural formula (14) is determined by $^1$H-NMR and FAB-MASS.

[Chemical Formula 36]

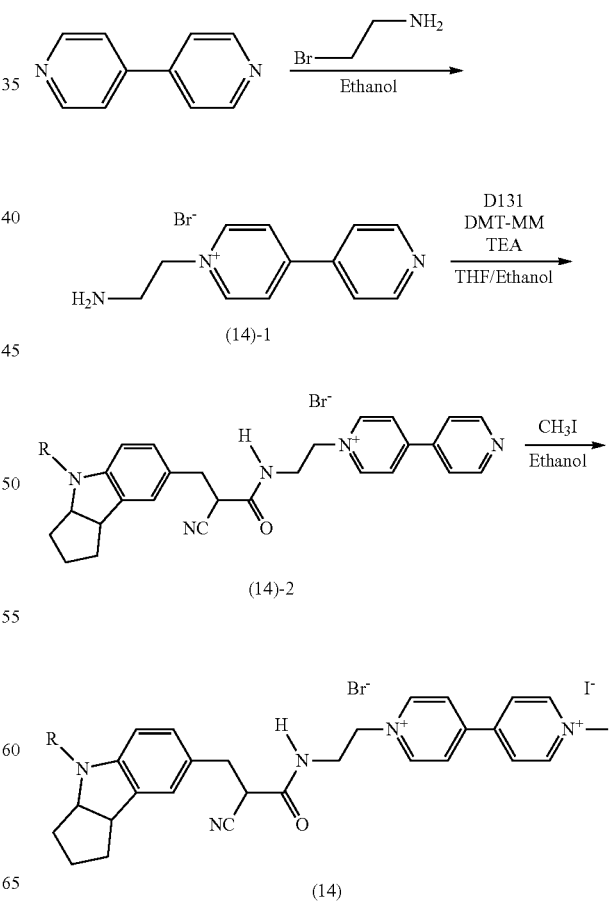

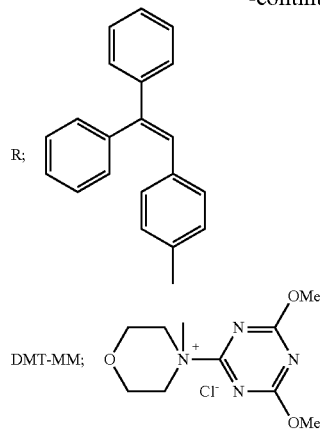

(Production of Element)

A paste for screen printing was prepared by dispersing GZO (Tin oxide doped with gallium) having an average primary particle diameter of 40 nm into ethyl cellulose.

This paste for screen printing was applied onto an electrically conductive glass substrate (tin oxide doped with fluorine, surface resistance of 100 Ω/square) having a thickness of 1 mm, and subsequently dried to give a dry film. This dry film was burned at 500° C. for 60 min in the air. Consequently, a semiconductor was formed on a surface of a first electrode.

An acetonitrile solution containing the photo-absorption material represented by the structural formula (14) was prepared. A concentration of the photo-absorption material in the solution was adjusted to 0.2 mM.

The first electrode with the semiconductor was immersed into this acetonitrile solution containing the photo-absorption material and placed statically in a dark room at 24 hours at room temperature. Consequently, a photosensitizer was formed into a layer shape on a surface of the semiconductor.

To obtain a second electrode (counter electrode), a platinum film was formed on a surface of an electrically conductive glass substrate (available from Nippon Sheet Glass Co., Ltd., fluorine doped $SnO_2$, a surface resistance; 10 Ω/square) by means of heat reduction of chloroplatinic acid.

Next, the first electrode and the second electrode were arranged to face each other so that the semiconductor was interposed between the first electrode and the second electrode. Between the first electrode and the second electrode, a sealing (hot-melt adhesive available from DuPont, "Bynel") was provided so as to surround the semiconductor except for one side of the semiconductor. The electrically conductive glass substrate with the first electrode and the electrically conductive glass substrate with the second electrode were heated and pressed against each other while they are arranged in the aforementioned manner. Consequently, the electrically conductive glass substrates were bonded to each other with the hot-melt adhesive.

An electrolyte solution was prepared by dissolving TEMPO and sodium chloride into water to have concentrations of 0.01 mol/dm$^3$ of TEMPO and 0.1 mol/dm$^3$ of sodium chloride. In order to form a charge-transport layer, the electrolyte solution was poured into a space between the first electrode and the second electrode from a gap which was not closed with the sealing. Subsequently, the gap which was not closed with the sealing was closed with a UV curing resin. Consequently, a photoelectric conversion element having a light-receiving area of 1 cm$^2$ was obtained.

The element was evaluated in a similar manner to that for Comparative Example 1. Table 1 shows the result.

Example 4

Example 4 was different from Comparative Example 2 in that ITO was used for forming a second electrode and 4-hydroxy-TEMPO phosphate represented by the structural formula above [Chemical Formula 32] was modified to form a second charge-transport layer. The method for formation will be described hereinafter.

First, ITO was immersed into IPA and washed with ultrasonic wave for 10 min. This second electrode was immersed into 0.01M 4-hydroxy-TEMPO phosphate aqueous solution for a whole day and night to form the second charge-transport layer on the second electrode. Furthermore, CN-TEMPO was used instead of TEMPO dissolved in the electrolytic solution in Comparative Example 2 for forming a charge-transport layer (the first charge-transport layer).

Other components were prepared in similar manners to those for Comparative Example 2 to obtain a photoelectric element.

Note that, the oxidation-reduction potential of the oxidation-reduction material in the first charge-transport layer was higher than the oxidation-reduction potential of the oxidation-reduction material in the second charge-transport layer by 60 mV.

Example 5

Example 5 was different from Comparative Example 3 in that ITO was used for forming the second electrode and 4-hydroxy-TEMPO phosphate represented by the structural formula above [Chemical Formula 32] was modified to form the second charge-transport layer. The method for formation will be described as follows.

First, ITO was immersed into IPA and washed with ultrasonic wave for 10 min. This second electrode was immersed into 0.01M 4-hydoxy-TEMPO phosphate aqueous solution for a whole day and night to form the second charge-transport layer on the second electrode. Furthermore, CN-TEMPO was used instead of TEMPO dissolved in the electrolytic solution in Comparative Example 3 for forming a charge-transport layer (the first charge-transport layer).

Other components were prepared in similar manners to those for Comparative Example 3 to obtain a photoelectric element.

Note that, the oxidation-reduction potential of the oxidation-reduction material in the first charge-transport layer was higher than the oxidation-reduction potential of the oxidation-reduction material in the second charge-transport layer by 60 mV.

Example 6

Example 6 was different from Comparative Example 3 in that a compound represented by the structural formula [Chemical formula 33] was used for forming the second charge-transport layer on a second electrode. Furthermore, CN-TEMPO was used instead of TEMPO dissolved in the electrolytic solution in Comparative Example 3 for forming a charge-transport layer (the first charge-transport layer). Other components were prepared in similar manners to those for Comparative Example 3 to obtain a photoelectric element.

Note that, the oxidation-reduction potential of the oxidation-reduction material in the first charge-transport layer was higher than the oxidation-reduction potential of the oxidation-reduction material in the second charge-transport layer by 40 mV.

The second charge-transport layer was formed in a similar manner to that for Example 2.

10 mg of the obtained compound was dissolved in 1 mL of solvent of DMF and applied with spin coating to form a second charge-transport layer having a thickness of 100 nm.

Example 7

Example 7 was different from Comparative Example 3 in that a diaphragm was provided with the second charge-transport layer, and that the diaphragm was disposed on a side close to the second electrode of a charge-transport layer (first charge-transport layer). A cellulose film having a thickness of 10 μm was used as the diaphragm. Furthermore, CN-TEMPO was used instead of TEMPO dissolved in an electrolytic solution in Comparative Example 3 for forming a charge-transport layer (first charge-transport layer).

Other components were prepared in similar manners to those for Comparative Example 1 to obtain an element.

Note that, the oxidation-reduction potential of the oxidation-reduction material in the first charge-transport layer was higher than the oxidation-reduction potential of the oxidation-reduction material in the second charge-transport layer by 300 mV.

TABLE 2

| | Ex. 4 | Ex. 5 | Ex. 6 | Ex. 7 | Com. Ex. 2 | Com. Ex. 3 |
|---|---|---|---|---|---|---|
| Open-circuit voltage Voc (mV) | 863 | 296 | 310 | 621 | 820 | 46 |
| Short-circuit current Jsc (μA/cm$^2$) | 0.5 | 2.0 | 1.3 | 0.6 | 0.2 | 0.5 |
| Maximum Power Pmax (μW/cm$^2$) | 0.22 | 0.30 | 0.20 | 0.19 | 0.1 | 0.1 |

The results shown in Table 2 teach that Examples 4 to 7 in which the second charge-transport layer was formed have higher photoelectric conversion efficiency than Comparative Examples 2 and 3.

REFERENCE SIGNS LIST

1 First electrode
2 Second electrode
3 Semiconductor
4 Photosensitizer
5 First charge-transport layer
6 Second charge-transport layer
7 Diaphragm

The invention claimed is:

1. A photoelectric element comprising:
 a first electrode;
 a second electrode positioned so as to face the first electrode;
 a semiconductor disposed on a face of the first electrode, the face being positioned so as to face the second electrode;
 a photosensitizer carried on the semiconductor;
 a first charge-transport layer located between the first electrode and the second electrode; and
 a second charge-transport layer located between the first charge-transport layer and the second electrode,
 wherein:
 the first charge-transport layer and the second charge-transport layer contain different oxidation-reduction materials; and
 the oxidation-reduction material in the first charge-transport layer has an oxidation-reduction potential higher than an oxidation-reduction potential of the oxidation-reduction material in the second charge-transport layer.

2. The photoelectric element according to claim 1, wherein the second-transport layer and the second electrode are chemically bonded with each other.

3. The photoelectric element according to claim 1, wherein the second charge-transport layer is formed of polymer gel.

4. The photoelectric element according to claim 1, further comprising
 a diaphragm provided on a side of the second charge-transport layer adjacent to the first charge-transport layer and located between the first charge-transport layer and the second charge-transport layer.

5. The photoelectric element according to claim 4, wherein the diaphragm is selected from a group consisting of porous glass, a cellulose film, a salt bridge, and an ion exchange film.

6. The photoelectric element according to claim 1, wherein the oxidation-reduction potential of the oxidation-reduction material in the first charge-transport layer is higher than the oxidation-reduction potential of the oxidation-reduction material in the second charge-transport layer by 60 mV or more.

7. The photoelectric element according to claim 1, wherein:
 the first charge-transport layer includes a solvent in which the oxidation-reduction material in the first charge-transport layer dissolves;
 the second charge-transport layer includes a solvent in which the oxidation-reduction material in the second charge-transport layer dissolves; and
 the solvents of the first charge-transport layer and the second charge-transport layer have the same composition.

8. The photoelectric element according to claim 7, wherein the oxidation-reduction material in the second-transport layer and the second electrode are chemically bonded with each other.

9. The photoelectric element according to claim 7, wherein the second charge-transport layer is formed of polymer gel.

10. The photoelectric element according to claim 7, further comprising
 a diaphragm provided between the first charge-transport layer and the second charge-transport layer, the second charge-transport layer being disposed on the first charge-transport layer while the diaphragm is located between the first charge-transport layer and the second charge-transport layer.

11. The photoelectric element according to claim 10, wherein
 the diaphragm is selected from a group consisting of porous glass, a cellulose film, a salt bridge, and an ion exchange film.

* * * * *